(12) United States Patent
Ahn et al.

(10) Patent No.: US 10,062,574 B2
(45) Date of Patent: Aug. 28, 2018

(54) WAFER POLISHING APPARATUS AND METHOD

(71) Applicant: SK SILTRON CO., LTD., Gumi-si Gyeongsangbuk-do (KR)

(72) Inventors: Jin-Woo Ahn, Gumi-si (KR); Kee-Yun Han, Gumi-si (KR)

(73) Assignee: SK SILTRON CO., LTD., Gumi-si, Gyeongsangbuk-Do (KR)

( * ) Notice: Subject to any disclaimer, the term of this patent is extended or adjusted under 35 U.S.C. 154(b) by 238 days.

(21) Appl. No.: 14/834,519

(22) Filed: Aug. 25, 2015

(65) Prior Publication Data
US 2016/0189972 A1    Jun. 30, 2016

(30) Foreign Application Priority Data
Dec. 29, 2014 (KR) ........................ 10-2014-0191612

(51) Int. Cl.
*B24B 37/04* (2012.01)
*B24B 37/005* (2012.01)
(Continued)

(52) U.S. Cl.
CPC ...... *H01L 21/30625* (2013.01); *B24B 37/005* (2013.01); *B24B 37/04* (2013.01);
(Continued)

(58) Field of Classification Search
CPC ....... B24B 37/005; B24B 37/04; B24B 37/10; B24B 37/105; B24B 37/30; B24B 49/12; B24B 49/16
(Continued)

(56) References Cited

U.S. PATENT DOCUMENTS

| 6,171,513 B1* | 1/2001 | Davis ...................... B24B 37/30 216/88 |
| 2005/0272355 A1* | 12/2005 | Jung ................... B24B 37/0053 451/285 |

(Continued)

FOREIGN PATENT DOCUMENTS

| JP | 05-192864 | 8/1993 |
| JP | 2001-105305 A | 4/2001 |

(Continued)

OTHER PUBLICATIONS

Korean Office Action dated Apr. 14, 2016 issued in Application No. 10-2014-0191612.
(Continued)

*Primary Examiner* — Eileen Morgan
(74) *Attorney, Agent, or Firm* — KED & Associates, LLP

(57) ABSTRACT

A wafer polishing apparatus capable of maintaining a drive ring in a flat state and a wafer polishing method are provided.
In the wafer polishing apparatus and method according to an embodiment, when the head assembly moves to the initial descending position by the wafer elevation unit, the shape of the drive ring inside the head assembly may be measured by using the sensor, and thus the polishing process may be performed in the state where the descending position of the head assembly is automatically adjusted by using the head auxiliary elevation unit to maintain the drive ring in the flat state.
Therefore, since the wafer polishing process is performed in the state the balance of the wafer mounting part is automatically adjusted by using the drive ring, the polishing quality of the wafer may be uniformly maintained, and also the polishing performance may be improved.

7 Claims, 5 Drawing Sheets

(51) Int. Cl.
- *B24B 37/30* (2012.01)
- *B24B 49/12* (2006.01)
- *H01L 21/306* (2006.01)
- *B24B 49/16* (2006.01)
- *B24B 37/10* (2012.01)

(52) U.S. Cl.
CPC ............ *B24B 37/105* (2013.01); *B24B 37/30* (2013.01); *B24B 49/12* (2013.01); *B24B 49/16* (2013.01)

(58) Field of Classification Search
USPC ................ 451/6, 9, 10, 11, 41, 285, 287
See application file for complete search history.

(56) References Cited

U.S. PATENT DOCUMENTS

| | | | |
|---|---|---|---|
| 2011/0124273 A1* | 5/2011 | Roh | ................ B24B 7/228 451/259 |
| 2014/0357164 A1 | 12/2014 | Nabeya et al. | |

FOREIGN PATENT DOCUMENTS

| | | |
|---|---|---|
| JP | 2002-343754 | 11/2002 |
| JP | 2007-152498 | 6/2007 |
| KR | 10-2007-0085590 | 8/2007 |

OTHER PUBLICATIONS

Korean Notice of Allowance dated Sep. 29, 2016 issued in Application No. 10-2014-0191612.

\* cited by examiner

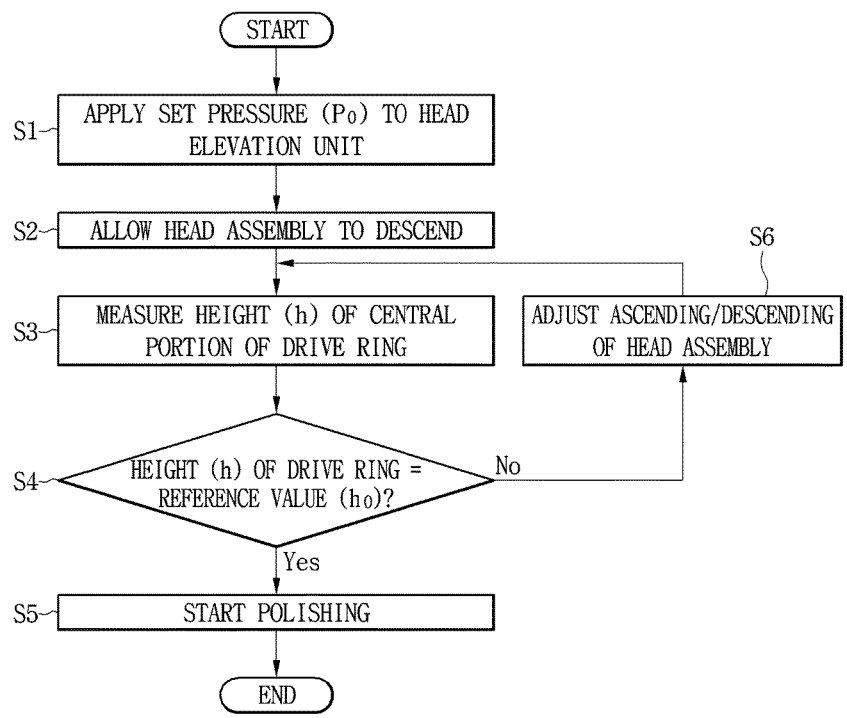

WAFER POLISHING APPARATUS AND METHOD

CROSS-REFERENCE TO RELATED APPLICATIONS

The present application claims priority under 35 U.S.C. 119 and 35 U.S.C. 365 to Korean Patent Application No. 10-2014-0191612 (filed on Dec. 29, 2014), which is hereby incorporated by reference in its entirety.

BACKGROUND

The present disclosure relates to a wafer polishing apparatus capable of maintaining a drive ring in a flat state and a wafer polishing method.

In general, a mirror polishing process is performed in a wafer manufacturing process to improve planarization of a wafer, and the most important technology of the planarization technologies is chemical mechanical polishing (CMP).

In the CMP, a semiconductor wafer is polished in contact with a polishing surface while slurry that is a chemical abrasive is supplied to the polishing surface.

The polishing apparatus includes a polishing table having the polishing surface provided with a polishing pad and a pressing head for pressing a semiconductor wafer. When the semiconductor wafer is polished by using the polishing apparatus, a predetermined pressure is applied to allow the semiconductor wafer to contact the polishing pad of the polishing table while the pressing head presses the semiconductor wafer. Here, the polishing table and the pressing head relatively move to allow the semiconductor wafer to contact the polishing surface so that a surface of the semiconductor wafer is planarized and polished to a mirror surface.

Japanese Laid-Open Patent Publication No. 2001-105305 discloses a head assembly structure of a polishing apparatus, which includes a housing and combustible drive ring for forming a pressing chamber in which a predetermined pressure is applied to a lower portion of a spindle shaft to easily support a substrate and adsorbs a wafer onto a bottom surface thereof through various components disposed below the drive ring.

FIGS. 1A to 1B are views illustrating deformation of a drive ring of a head assembly according to the related art.

As illustrated in FIGS. 1A and 1B, in the head assembly according to the related art, a polishing process is performed while the wafer and the polishing pad rotate in directions opposite to each other after the wafer descends up to a polishing pad placed on a platen in a state where the wafer is adsorbed.

In general, the polishing pad used for a final polishing process is constituted by a Nap layer and a base material pad formed of felt. As the polishing process is performed, all of the base material pad and the Nap layer decrease in thickness.

The head assembly descends by a set height to allow the wafer to contact the polish pad, thereby performing the final polishing process. Here, although the drive ring inside the head assembly is maintained in a flat shape at the beginning, as the polishing pad varies in thickness, the drive ring inside the head assembly varies in shape.

When the polishing pad decreases in thickness due to the repeated polishing processes, a central portion of the drive ring 12 is deformed in a concave shape as illustrated in FIG. 1A. As a result, a gap may occur between a sleeve and flange which constitute a wafer mounting part 13, and also, a central axis of the wafer mounting part 13 may horizontally move during the polishing process.

On the other hand, when the polishing pad is newly replaced to increase in thickness, the central portion of the drive ring 12 is deformed in a convex shape as illustrated in FIG. 1B. As a result, a load may be concentrated into an edge portion of the wafer mounting part 13 to increase a polishing amount at the edge portion of the wafer mounting part 13.

As described above, in the wafer polishing apparatus according to the related art, when the polishing pad changes in thickness, the drive ring 12 for balancing the wafer mounting part 13 may be deformed. Therefore, it may be difficult to uniformly maintain polishing quality of the wafer, as well as, polishing performance may be deteriorated.

SUMMARY

Embodiments provide a wafer polishing apparatus that is capable of detecting deformation of a drive ring to automatically adjust ascending/descending positions of a head assembly, thereby maintaining the drive ring in a flat state and a wafer polishing method.

In one embodiment, a wafer polishing apparatus includes: a housing providing a predetermined pressure space thereunder; a drive ring flatly connected to a lower portion of the housing, the drive ring having a central portion that is vertically variable in shape; a head assembly disposed on a lower portion of the drive ring, the head assembly including a wafer mounting part having a bottom surface on which a wafer is mounted; a head elevation unit disposed on an upper portion of the housing to vertically elevate the head assembly according to a control pressure; a sensor disposed on a central portion of the drive ring to measure a height of the central portion of the drive ring; and a head auxiliary elevation unit disposed on the head elevation unit to adjust a height of the head assembly so that the central portion of the drive ring is flat according to a value measured by the sensor.

In another embodiment, a wafer polishing method in which a wafer adsorbed onto a head assembly including a wafer mounting part that is balanced according to a flat shape of a drive ring is polished by using a polishing pad placed on a platen, the wafer polishing method includes: a first process of allowing the wafer to contact the polishing pad when the head assembly descends as a predetermined pressure is provided thereto; a second process of measuring a shape of the central portion of the drive ring; and a third process of adjusting a height of the head assembly according to the shape of the central portion of the drive ring.

BRIEF DESCRIPTION OF THE DRAWINGS

FIG. 6 is a flowchart of a wafer polishing method according to an embodiment.

DETAILED DESCRIPTION OF THE EMBODIMENTS

Hereinafter, embodiments will be described in detail with reference to the attached drawings. The scope of the spirit of the embodiment may be defined from the contents disclosed in the embodiment, and the spirit of the embodiment may include any implementation changes such as addition, removal, and change of components with respect to the suggested embodiment.

Figure 1A:
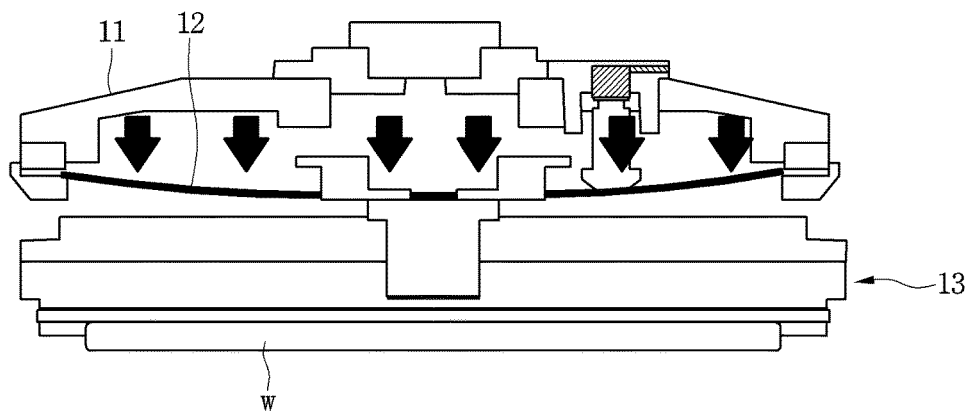
FIGS. 1A to 1B are views illustrating deformation of a drive ring of a head assembly according to a related art.
Figure 1B:
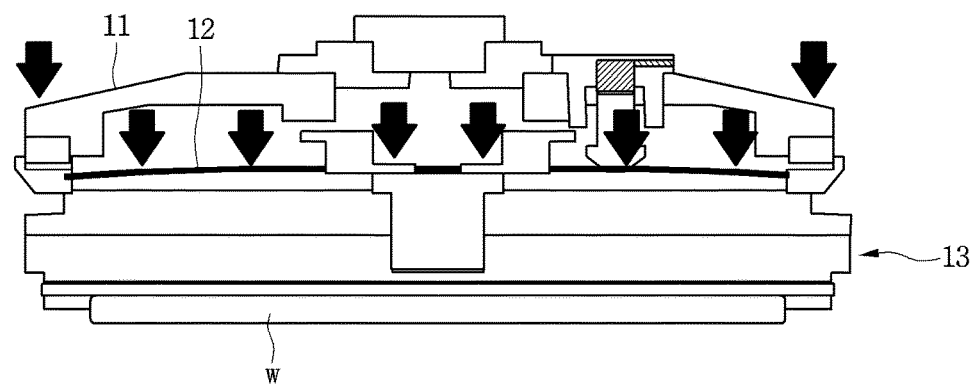
Figure 2:
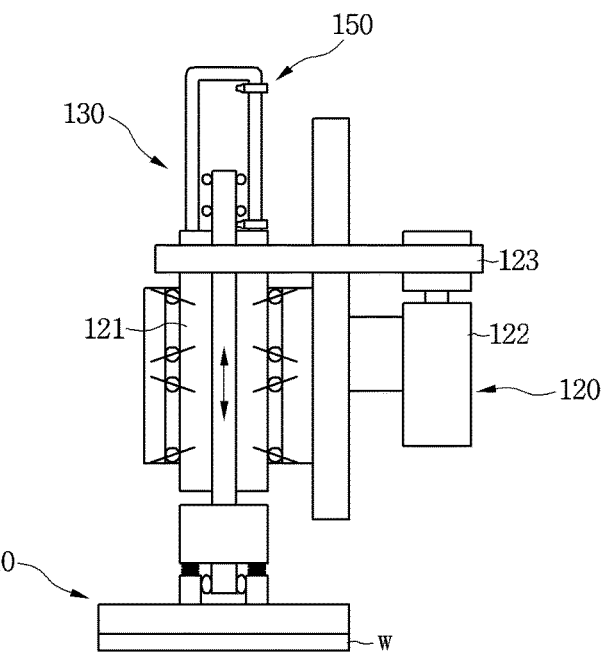
FIG. 2 is a view of a wafer polishing apparatus according to an embodiment.
Figure 2:
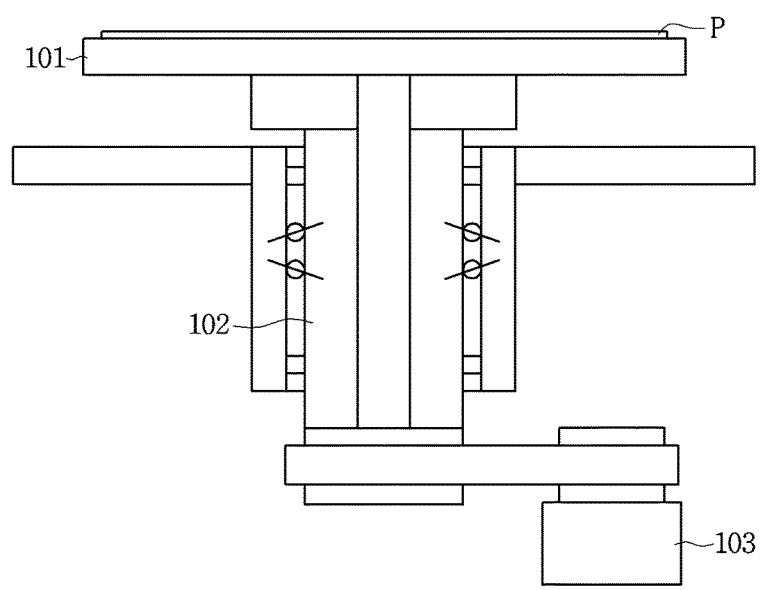

FIG. 2 is a view illustrating a wafer polishing apparatus according to an embodiment.

The wafer polishing apparatus according to an embodiment includes a platen 101 on which a polishing pad P is placed and a head assembly 110 to which a wafer W is adsorbed as illustrated in FIG. 2. The platen 101 and the head assembly 110 are rotatably mounted.

The platen 101 having a disc shape. A driving shaft 102 is disposed at a center of a bottom surface of the platen 101, and a separate driving motor 103 is disposed on a side of the driving shaft 102 to rotate the driving shaft 102.

The head assembly 110 may be rotatably installed by a head rotation unit 120. The head assembly 110 may be vertically elevated by the head elevation unit 130 and automatically finely adjusted in vertical height by a head auxiliary elevation unit 150.

The head assembly 110 vacuum-adsorbs a wafer W onto a lower portion thereof, and this will be described below in detail.

The head rotation unit 120 includes a rotational shaft 121 disposed above the head assembly 110, a rotation motor 122 for providing a rotational force to the rotational shaft 121, and a pulley and belt 123 for transmitting a power of the rotation motor 122 to the rotational shaft 121.

An elevation shaft 131 of the head elevation unit 130, which will be described below in detail, is directly connected to an upper portion of the head assembly 110, and the rotational shaft 121 is disposed to surround the elevation shaft 131.

Here, the elevation shaft 131 is elevatably installed inside the rotational shaft 121. Also, the elevation shaft 131 may be rotatably installed together with the rotational shaft 121.

Figure 3:
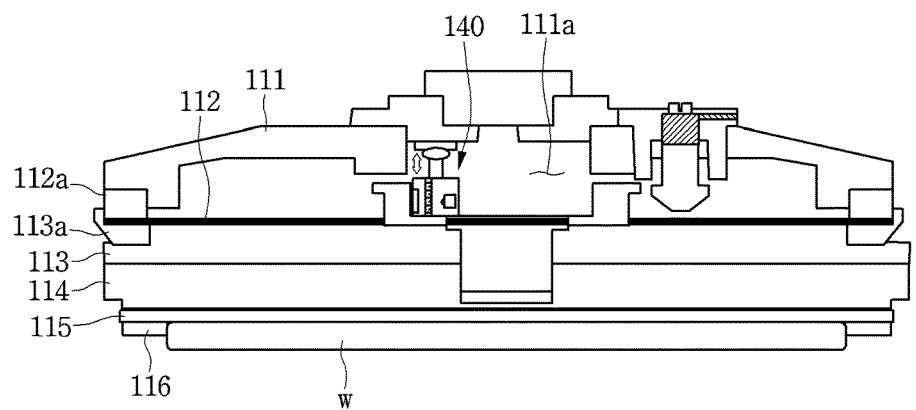
FIG. 3 is a view illustrating a head assembly applied in FIG. 2.

FIG. 3 is a view illustrating the head assembly applied in FIG. 2.

The head assembly 110 has a shape that is capable of vacuum-adsorbing a wafer. As illustrated in FIG. 3, the head assembly 110 includes a housing 111, a drive ring 112 fixed by a tension sleeve 112a and a flange 113a to cover a bottom surface of the housing 111, and a wafer mounting part disposed to be stacked on a lower portion of the drive ring 112.

The housing 111 has a predetermined pressure space 111a thereunder and has an opened lower side and stepped space on a circumference of a lower end thereof.

Of course, a separate pressure apply unit is connected to the housing 111 to provide a predetermined pressure into the housing 111, and its detail description will be omitted.

The tension sleeve 112a is mounted to be engaged with the stepped end of the lower end of the housing 111, and the flange 113a is mounted to be engaged with a lower portion of an outer circumference of the tension sleeve 112a. An outer circumferential end of the drive ring 112 is fixed between the tension sleeve 112a and the flange 113a.

The drive ring 112 is installed to cover the opened lower side of the housing 111 and has a plurality of holes having a disc shape to transmit a predetermined pressure. Also, the drive ring 112 is formed of a soft material so that a central portion thereof is vertically elevated.

The wafer mounting part includes a sleeve 113, a ceramic block 114, a template assembly 115, and a guide part 116. A passage through which a vacuum pressure between the housing 111 and the drive ring 112 is transmitted is defined in the sleeve 113 and the ceramic block 114.

The sleeve 113 contacts a bottom surface of the drive ring 112 and mounted to be engaged with a lower portion of an inner circumferential surface of the flange 113a.

The ceramic block 114 is disposed on a lower portion of the sleeve 113 to reinforce strength of the sleeve 113.

The template assembly 115 may be a kind of non-slip pad formed of a material such as polyurethane. The template assembly 115 is disposed below the ceramic block to adsorb or press the wafer W.

The guide part 116 is disposed on a circumference of a bottom surface of the template assembly 115 to guide a circumferential portion of the wafer W.

Accordingly, when the vacuum pressure is applied into a pressure space 111a of the housing 111, the pressure is transmitted to the wafer mounting part through the drive ring 112, and thus the wafer W is adsorbed onto the bottom surface of the template assembly 115.

Figure 4:
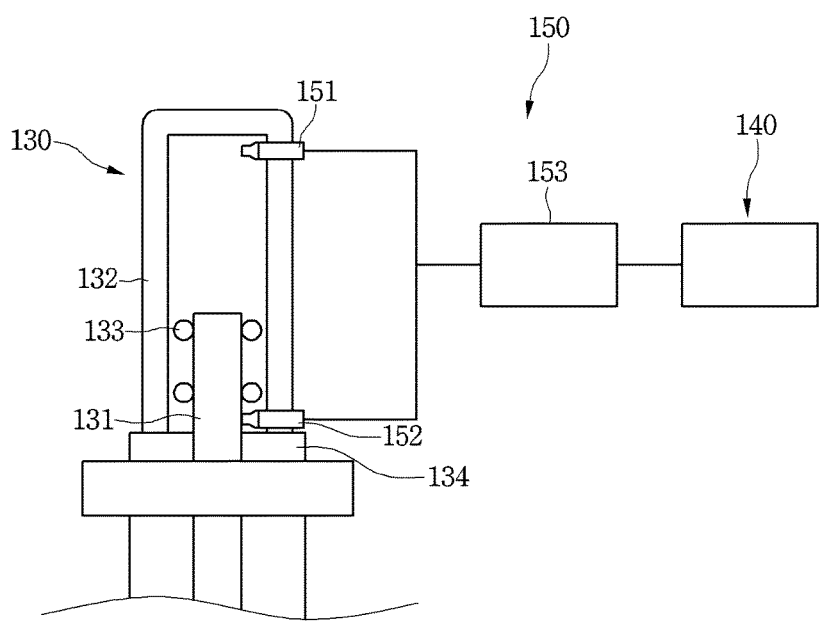
FIG. 4 is a view illustrating a head elevation unit applied in FIG. 2.

FIG. 4 is a view illustrating the head elevation unit applied in FIG. 2.

The head elevation unit 130 may be a kind of cylinder. As illustrated in FIG. 4, is installed such that an elevation shaft 131 is disposed inside the cylinder housing 132 to elevate.

The elevation shaft 131 may be directly connected to an upper portion of the head assembly (see reference numeral 110 of FIG. 2) and may rotate together with the rotational shaft (see reference numeral 121 of FIG. 2) as described above.

The cylinder housing 132 may has a predetermined pressure space therein and apply a separate pressure to the pressure space.

Here, the cylinder housing 132 accommodates an upper end of the elevation shaft 131 therein such that at least one sealing part 133 disposed on a circumference of the elevation shaft 131 is engaged with an inner wall of the cylinder housing 131.

Although the sealing part 133 is disposed between the elevation shaft 131 and the cylinder housing 132, the upper end of the elevation shaft 131 is elevatable inside the cylinder housing 132.

A manual adjustment member 134 disposed to be engaged with the elevation shaft 131 may be disposed on a lower portion of the cylinder housing 132. The manual adjustment member 134 may be manually adjusted to adjust a height of the elevation shaft 131.

Furthermore, a head auxiliary elevation unit 150 may be disposed on a side of the cylinder housing 132 to automatically adjust a height of the elevation shaft 131.

In more detail, the head auxiliary elevation unit 150 includes upper/lower nozzles 151 and 152 for providing a pressure into the cylinder housing 132 and a pressure control part 153 for controlling the pressure provided to the upper/lower nozzles 151 and 152. The head auxiliary elevation unit 150 is controlled in operation by a value inputted from a sensor 140 for measuring the shape of the above-described drive ring (see reference numeral 112 in FIG. 3).

The upper nozzle 151 is disposed on an upper portion of the cylinder housing 132 above the sealing part 133. Accordingly, when a pressure is provided from the upper nozzle 151, since a pressure in the upper space of the housing 132 with respect to the sealing part 133 is relatively high, the elevation shaft 131 descends.

The lower nozzle 152 is disposed on a lower portion of the cylinder housing 132 below the sealing part 133. Accordingly, when a pressure is provided from the lower nozzle 152, since a pressure in the lower space of the housing 132 with respect to the sealing part 133 is relatively high, the elevation shaft 131 ascends.

The pressure control part 153 controls a pressure provided to the upper/lower nozzles 151 and 152 according to a value inputted from the sensor 140.

In detail, when the drive ring has the concave shape measured by the sensor 140, the pressure control part 153 controls the pressure so that the pressure is provided to the upper nozzle 151, and when the ring has the convex shape measured by the sensor 140, the pressure control part 153 controls the pressure so that the pressure is provided to the lower nozzle 152.

Figure 5:
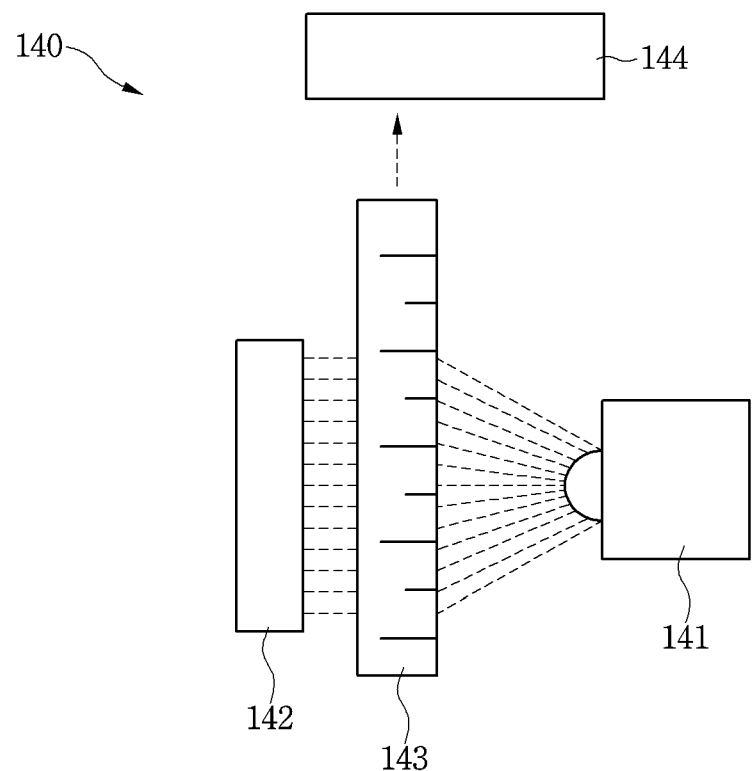
FIG. 5 is a view illustrating a sensor for detecting deformation of a drive ring applied in FIG. 2.

FIG. 5 is a view illustrating the sensor detecting the deformation of the drive ring applied in FIG. 2.

The sensor 140 may be provided as an optical linear scale type. As illustrated in FIGS. 3 and 5, the sensor 140 includes a light emitting part 141, a light receiving part 142, a linear scale 143, and an amplifier 144.

Of course, the sensor 140 may be mounted on the sleeve disposed above the central portion of the drive ring 112.

The light emitting part 141 and the light receiving part 142 are spaced a predetermined distance from each other in a horizontal direction. An LED generating light may be used as the light emitting part 141, and a photodiode detecting light may be used as the light receiving part 142.

The linear scale 143 is disposed vertically movable between the light emitting part 141 and the light receiving part 142 and includes an index scale through which light passes.

Here, the linear scale 143 may be in contact with the housing 111. The linear scale 143 may be disposed to measure a distance with respect to an inner top surface of the housing 111 as the central portion of the drive ring 112 elevates.

The amplifier 144 detects and amplifies data transmitted to the light receiving part 143 so as to measure fine movement even.

Thus, when the central portion of the drive ring 112 ascends/descends, an amount of light passing through the index scale continuously varies as the linear scale 143 moves with reference to the inner top surface of the housing 111, thereby measuring a height of the drive ring 112 with reference to the housing 111 and detecting a shape of the central portion of the drive ring 112.

Here, when the central portion of the drive ring 112 ascends to have the concave shape, a distance between the housing 111 and the drive ring 112 is measured to be less than a reference value. On the other hand, when the central portion of the drive ring 112 descends to have the convex shape, a distance between the housing 111 and the drive ring 112 is measured to be greater than the reference value.

FIG. 6 is a flowchart of a wafer polishing method according to an embodiment.

The wafer polishing method according to an embodiment is applied at a time point at which a wafer W of a head assembly 110 contacts a polishing pad P of a platen 101 just before a polishing process starts. A process in which the head assembly 110 is automatically adjusted in height to allow a drive ring 112 to be maintained in a flat state will be described below with reference to FIGS. 2, 3, and 6.

When a set pressure $P_0$ is applied to a head elevation unit 130, the head assembly 110 descends up to an initial set position in operations S1 and S2.

Of course, when the wafer W of the head assembly 110 descends up to the initial position, the wafer W may contact the polishing pad P of the platen 101.

However, when the polishing pad P decreases in thickness due to repeated usage thereof, the wafer W of the head assembly 110 may not contact the polishing pad P of the platen 101 even though the wafer W of the head assembly 110 descends up to the initial position. Thus, the drive ring 112 inside the head assembly 110 may be deformed in a convex shape.

Also, when the polishing pad P is newly replaced to increase in thickness, the wafer W of the head assembly 110 may descend up to the initial position to excessively contact the polishing pad P of the platen 101. Thus, the drive ring 112 inside the head assembly 110 may be deformed in a concave shape because an excessive load is applied to a circumferential portion of the head assembly 110.

In operation S3, a height of a central portion of the drive ring 112 is measured by using a sensor 140.

Here, the sensor 140 may be provided as an optical linear scale type. As described above, a light emitting part and a light receiving part ascend/descend together with the central portion of the drive ring 112, but a linear scale may contact the housing 111.

Thus, when the central portion of the drive ring 112 ascends/descends, the light emitting part and the light receiving part ascends/descends with respect to the linear scale, and thus light passing through the linear scale may change. As a result, the height of the drive ring 112 may be measured according to the change of the light passing through the linear scale.

In operations S4 and S5, the polishing process starts when the height h of the drive ring 112 matches a reference value $h_0$.

Of course, the height h of the drive ring 112 may be previously inputted to the reference value $h_0$ in a state in which the drive ring 112 is flat to compare the height h of the drive ring 112, which is measured from the sensor 140, to the reference value $h_0$.

Here, when the height h of the drive ring 112 matches the reference value $h_0$, it is determined that the head assembly 110 is balanced because the drive ring 112 is flat, and thus the polishing process is performed without separately adjusting a position of the head assembly 110.

On the other hand, when the height h of the drive ring 112 does not match the reference value $h_0$, the ascending/descending of the head assembly 110 is adjusted by a head auxiliary elevation unit 150 in operations S4 and S6.

Here, when the height h of the drive ring 112 does not match the reference value $h_0$, it is determined that the head assembly 110 is not balanced because the drive ring 112 is deformed in a convex or concave shape, and thus the head assembly 110 is automatically adjusted in position.

In detail, when the drive ring 112 has a height h less than the reference value $h_0$, it is determined that the central portion of the drive ring 112 ascends to be deformed in the concave shape, and thus the head auxiliary elevation unit 150 adjusts an initial descending position of the head assembly 110 to finely ascend.

On the other hand, when the drive ring 112 has a height $h_0$ greater than the reference value $h_0$, it is determined that the central portion of the drive ring 112 descends to be deformed in the convex shape, and thus the head auxiliary elevation unit 150 adjusts the initial descending position of the head assembly 110 to finely descend.

When the above-described processes are repeated, the balance of the head assembly 110 may be automatically adjusted at the initial descending position to improve worker's convenience. In addition, the polishing process may be performed in the state where the wafer W of the head assembly 110 contacts the polishing pad of the platen 101 at the uniform pressure to uniformly maintain the polishing quality and improve the polishing performance.

In the wafer polishing apparatus and method according to an embodiment, when the head assembly moves to the initial descending position by the wafer elevation unit, the shape of the drive ring inside the head assembly may be measured by using the sensor, and thus the polishing process may be performed in the state where the descending position of the head assembly is automatically adjusted by using the head auxiliary elevation unit to maintain the drive ring in the flat state.

Therefore, since the wafer polishing process is performed in the state the balance of the wafer mounting part is automatically adjusted by using the drive ring, the polishing quality of the wafer may be uniformly maintained, and also the polishing performance may be improved.

What is claimed is:

1. A wafer polishing apparatus, comprising:
    a housing providing a predetermined pressure space thereunder;
    a drive ring flatly connected to a lower portion of the housing, the drive ring having a central portion that is vertically variable in shape;
    a head assembly disposed on a lower portion of the drive ring, the head assembly comprising a wafer mounting part having a bottom surface on which a wafer is mounted;
    a head elevation unit disposed on an upper portion of the housing to vertically elevate the head assembly according to a control pressure;
    a sensor disposed on a central portion of the drive ring to measure a distance of the central portion of the drive ring to the housing; and
    a head auxiliary elevation unit disposed on the head elevation unit to adjust a height of the head assembly in response to a distance value measured by the sensor so that the central portion of the drive ring is flat during wafer polishing.

2. The wafer polishing apparatus according to claim 1, wherein the head assembly further comprises a sleeve disposed above the central portion of the drive ring, and
    the sensor is provided as an optical linear scale type that is disposed above the sleeve.

3. The wafer polishing apparatus according to claim 2, wherein the sensor comprises:
    a light emitting part disposed above the flange;
    a light receiving part horizontally spaced a predetermined distance from the light emitting part; and
    a linear scale movably disposed between the light emitting part and the light receiving part to measure a distance from the housing.

4. The wafer polishing apparatus according to claim 3, wherein the sensor further comprises an amplifier detecting data transmitted to the light receiving part to amplify the detected data.

5. The wafer polishing apparatus according to claim 1, wherein the head elevation unit comprises:
    an elevation shaft connected to an upper portion of the housing;
    a cylinder housing connected to an upper end of the elevation shaft to elevate the elevation shaft as a pressure is provided thereto;
    at least one sealing part disposed on a circumference of the elevation shaft, the at least one sealing part being engaged with an inner wall of the cylinder housing.

6. The wafer polishing apparatus according to claim 5, wherein the head auxiliary elevation unit comprises an upper nozzle providing a pressure into the cylinder housing from an upper side with respect to the sealing part.

7. The wafer polishing apparatus according to claim 5, wherein the head auxiliary elevation unit comprises a lower nozzle providing a pressure into the cylinder housing from a lower side with respect to the sealing part.

* * * * *